United States Patent
Linke et al.

(10) Patent No.: US 6,657,869 B1
(45) Date of Patent: Dec. 2, 2003

(54) METAL HOUSING, ESPECIALLY FOR AN AIRBAG CONTROL DEVICE

(75) Inventors: Ralph Linke, Radolfzell (DE); Georg Mascha, Radolfzell-Güttingen (DE); Willy Kretz, Pforzheim (DE)

(73) Assignees: TRW Automotive Electronics & Components GmbH & Co. KG (DE); Alutec Metallwaren GmbH & Co. (DE)

( * ) Notice: Subject to any disclaimer, the term of this patent is extended or adjusted under 35 U.S.C. 154(b) by 0 days.

(21) Appl. No.: 09/914,711

(22) PCT Filed: Jan. 24, 2000

(86) PCT No.: PCT/DE00/00193

§ 371 (c)(1),
(2), (4) Date: Feb. 4, 2002

(87) PCT Pub. No.: WO00/55013

PCT Pub. Date: Sep. 21, 2000

(30) Foreign Application Priority Data

Mar. 17, 1999 (DE) .......................................... 199 11 990

(51) Int. Cl.$^7$ ................................................. H05K 5/06
(52) U.S. Cl. ..................... 361/752; 361/807; 361/803; 361/800; 257/99
(58) Field of Search ................................. 361/752, 724, 361/714, 797, 800, 796, 803, 784, 807; 257/99

(56) References Cited

U.S. PATENT DOCUMENTS

| 4,555,638 A | 11/1985 | Lobe |
| 4,763,224 A | 8/1988 | Bentz et al. |
| 5,251,103 A | 10/1993 | Haberstroh et al. |
| 5,530,622 A | * 6/1996 | Takiar et al. ............... 361/737 |
| 5,912,806 A | * 6/1999 | Onoda et al. ............... 361/737 |

FOREIGN PATENT DOCUMENTS

| DE | 30 22 115 C2 | 10/1985 |
| DE | PCT/DE86/00028 | 11/1986 |
| DE | 41 23 261 C1 | 1/1993 |

* cited by examiner

Primary Examiner—Randy Gibson
Assistant Examiner—Hung Bui
(74) Attorney, Agent, or Firm—Fay, Sharpe, Fagan, Minnich & McKee, LLP

(57) ABSTRACT

The invention relates to a metal housing 1, especially for an airbag control device, comprising a bottom plate and a cover plate, a rear wall and two side walls 5, 6, having mounting elements in the interior of the housing for at least one printed circuit board, and with a terminal element arranged at the front side of the housing for at least one connection element. According to the invention, the bottom—and/or the cover plate is/are connected with an installation plate 22, 23 which is attachable to a support. In this arrangement, projections are being utilized which are embeddable in and can be pressed into recesses of the installation plate.

17 Claims, 4 Drawing Sheets

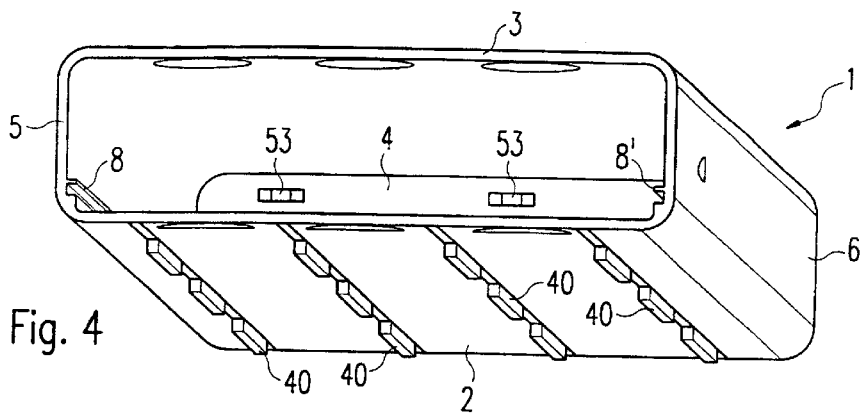
Fig. 4
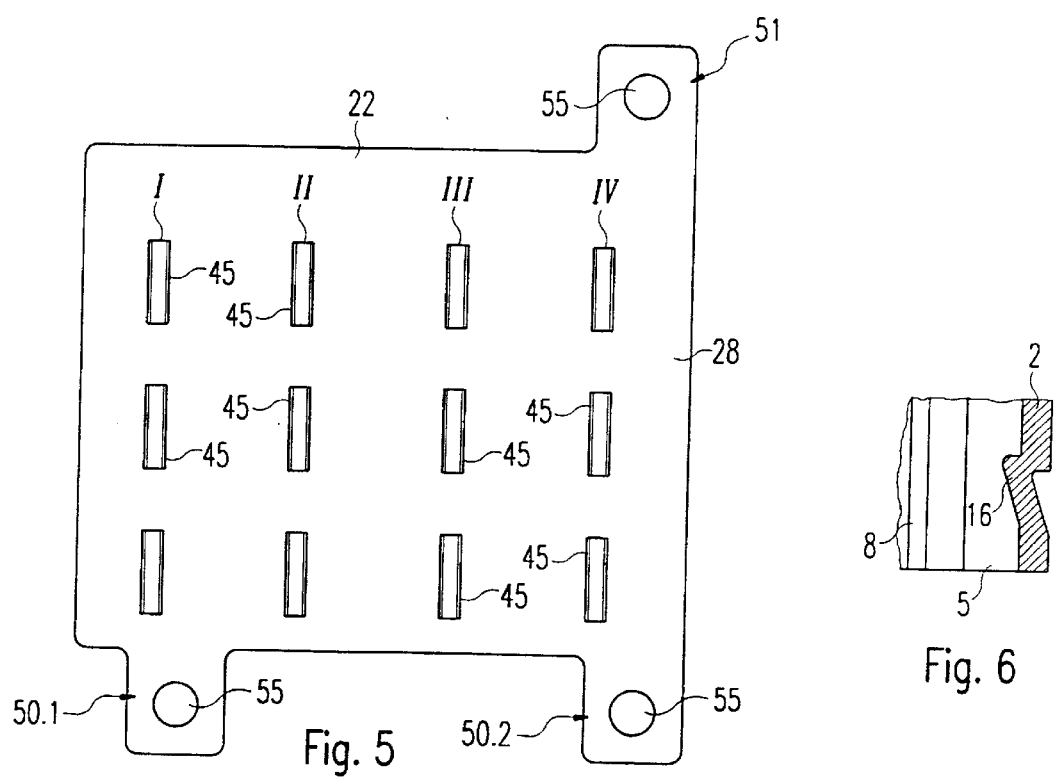
Fig. 5
Fig. 6
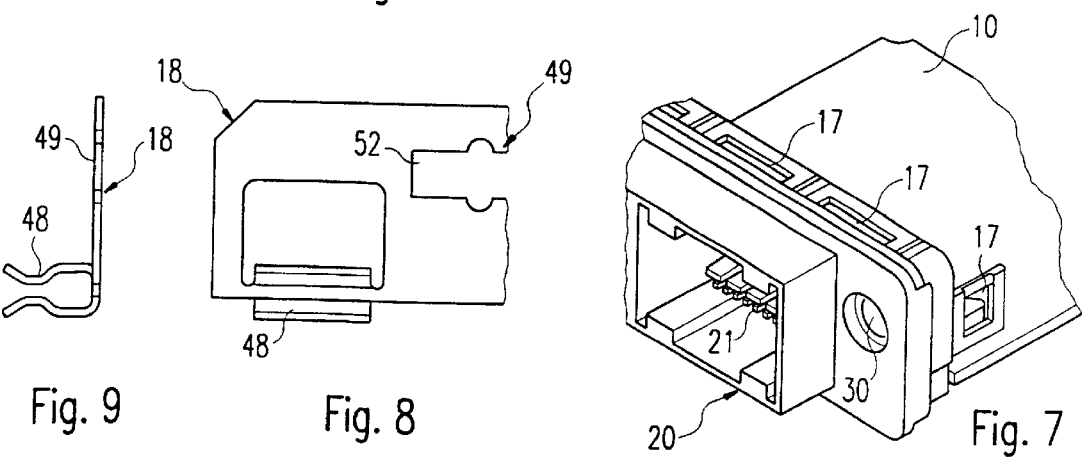
Fig. 9
Fig. 8
Fig. 7

METAL HOUSING, ESPECIALLY FOR AN AIRBAG CONTROL DEVICE

BACKGROUND OF THE INVENTION

The invention relates to housings that are particularly well suited for use with airbag control devices. The subject housing includes a bottom plate, a top plate, a rear wall, two side walls, and receiving elements arranged inside the housing for receiving at least one printed circuit board. The subject housing further includes a terminal element arranged at the front side of the housing and at least one connection element.

The general state of the art includes design of such housings comprising several components. The components are respectively adapted to the installation conditions. This results in substantial inventory maintenance costs. Additionally, the several components must be arranged so that the components are installed in a functionally correct manner.

In contrast thereto, it is an object of the invention to provide a housing of the aforementioned type in such a fashion so that the result is an element which can readily and quickly be adapted to its installation environment.

SUMMARY OF THE INVENTION

The above object and others are solved according to the invention in that the bottom plate and/or the cover plate of the housing is selectively connectable with one or more mounting plate(s) which is/are attachable to a support. The housing is of a single-piece construction and the bottom plate and/or cover plate of the housing is provided with projections. The projections are arranged and impressed inside recesses of the mounting plate. This produces the benefit that by means of the mounting plate, which is adapted to the mounting conditions, only a single housing is needed for use in a wide range of applications. Thereby, the housing can be attached, in any fashion, to an associated support by merely selecting a suitable mounting plate. Thus, only one housing type is required. The singular housing type is attachable to the support via the mounting plate. The mounting plate is adapted to fit the particular installation environment. Said mounting plate additionally effectuates a reinforcement function resulting, overall, in a stable structure.

In accordance with a further aspect of the invention, the projections extend in several parallel rows and/or lines. The projections are manufactured from ribs formed onto the bottom plate and/or the cover plate of the housing. This results in efficient manufacturing since the ribs and/or rows of ribs are formed integrally with the housing, as a single piece construction. Depending upon the installation requirements, the ribs or rows are machined, e.g. by milling, so that the locations and arrangement of the projections correspond to the recesses formed in the mounting plate.

Portions of the mounting plates selectively extend, at least in part, beyond the bottom plate and/or the cover plate to present attachment regions as desired. These attachment regions can, for example, serve as flanges that include at least one transverse opening, by which it is possible to attach the metal housing, e.g. an airbag control device housing, to the appropriate associated support in a functionally correct manner.

According to a first embodiment of the invention, the mounting plate is selectively fastened at either the bottom plate or the cover plate of the housing, and includes three attachment regions. In this arrangement, the mounting plate is attachable to the bottom plate or to the cover plate of the housing, and can be rotated by 180° with respect to its original position and relative to the cover or bottom plate of the housing. This arrangement of the mounting plate enables many mounting combinations, so that the metal housing can be installed in many types of motor vehicles without requiring vehicle-specific housing configurations.

In order to guarantee excellent control of the circuit board within the housing using the aforementioned attachment, in another embodiment of the invention, the side walls of the single-piece housing and the rear wall include guide elements for receiving and holding the circuit board. In a preferred arrangement, the guide elements of the side walls are preferably grooves defined by the side walls and the guide elements of the rear wall are electrically conducting contacts.

According to another aspect of the invention, the contacts define a fork-shaped area for contacting and supporting the circuit board and an area which is connectable with the rear wall and includes at least one opening that positions and presses together with a projection of the rear wall.

In order to provide another installation aid, in yet another embodiment, the terminating element is selectively connected via at least one detent connection with the front side of the housing. In this arrangement, detent units are provided in the area of the front side of the housing as desired. The detent units clip into corresponding detent grooves of the terminating element which is preferably made of plastic. In this way it is possible to connect, in simple fashion, the terminating element with the single-piece housing in a functionally correct manner.

Numerous benefits and advantages of the present invention will become apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

FIG. 4 shows a perspective view of the single-piece housing of the device of FIG. 1;

FIG. 5 shows a top view of the mounting plate of the device of FIG. 1;

FIG. 6 shows an enlarged view of a detent stop portion at the front side of the housing of the device of FIG. 1;

FIG. 7 shows a perspective view of a portion of the front area of the terminating elements of the device of FIG. 1;

FIG. 8 shows a partial front view of an electrically conductive contact;

FIG. 9 shows a side view of the contact according to FIG. 8;

DETAILED DESCRIPTION OF THE PREFERRED EMBODIMENTS

Figure 1:
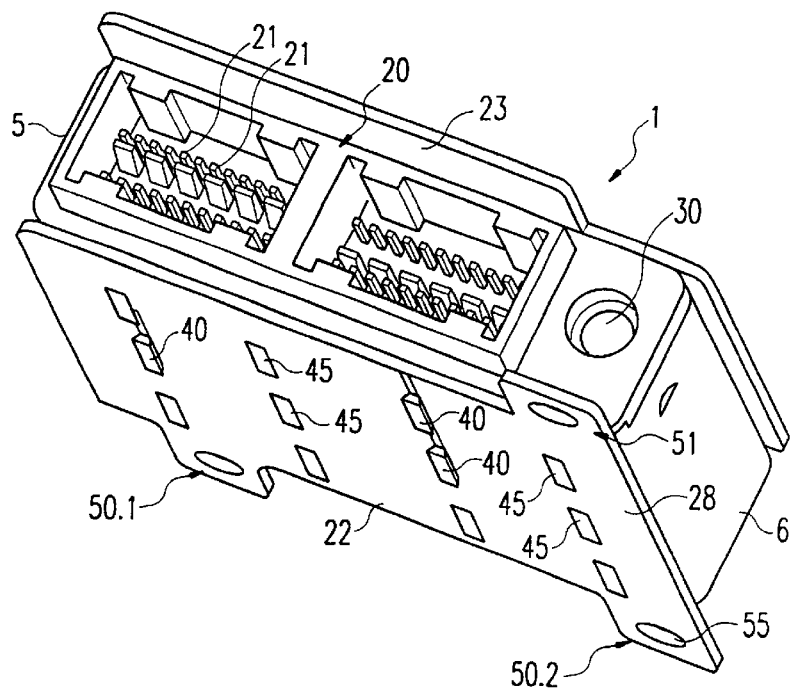
FIG. 1 shows a perspective view of a housing in accordance with a first embodiment of the invention used in an airbag control device application.

With reference to FIGS. 1 and 4, a metal housing 1, particularly suited for housing an airbag control device, includes a bottom plate 2, a cover plate 3, a rear wall 4, and two side walls 5, 6. These individual components of the housing 1 are all provided as a single unitary construction, i.e. as a single-piece housing. The single-piece housing 1 is preferably made of aluminum and is preferably produced in one manufacturing step, e.g. by continuous extrusion casting.

The front side of the housing is tightly closed by a terminating element 20, as best shown in FIG. 1. A circumferential gasket 25 (FIG. 3) provides sealing between the terminating element 20 and the interior wall and/or the front side of the housing 1. The gasket 25 seals the interior of the single-piece housing 1. The terminating element 20 preferably includes detent grooves 17 (FIG. 7) which are clipped into correspondingly designed detent stops 16 (FIG. 6) to provide a quick and secure connection between the plastic terminating element 20 and the single-piece housing 1.

With reference to FIGS. 1 through 5, the bottom plate 2 and/or the cover plate 3 are connected with one or more mounting plates 22, 23 which are attachable to a support (not shown). In the arrangement shown in FIGS. 2, 4, and 5, the bottom plate 2 includes projections 40 (FIG. 4). The mounting plate(s) 22 or 23 is/are positioned relative to the projections. The projections 40 are placed and impressed, after positioning, into recesses 45 (FIGS. 2 and 5) of the mounting plate 22 or 23.

Figures 2, 3:
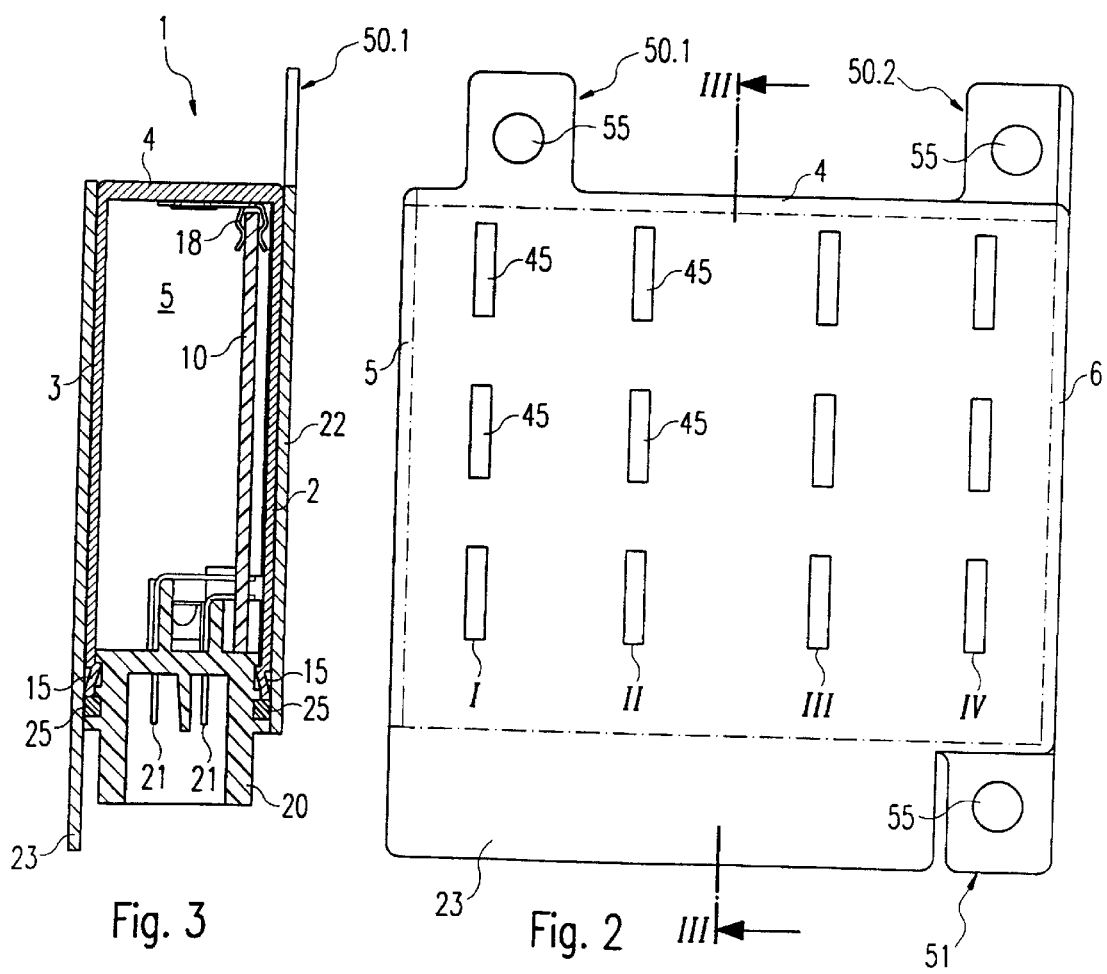
FIG. 2 shows a top view of the device of FIG. 1.
FIG. 3 shows a sectional view of the device of FIGS. 1 and 2 taken along the line III—III of FIG. 2.

With reference to FIGS. 2 and 5, the projections 40 preferably extend in several parallel rows I, II, III, and IV and are manufactured, e.g. by milling, from ribs formed onto the bottom plate 2 and/or the cover plate 3 during the extrusion process. By retention of a given detent and/or the manufacturing of installation plates 22 or 23 with different recesses, the metal housing 1 of the exemplary airbag control device is easily adapted to the installation environment and can be installed onto a wide range of supports corresponding to different types of motor vehicles.

As seen in FIG. 3, the installation plates 22 and 23 extend, at least partially, beyond the edge(s) of the bottom plate 2 and/or the cover plate 3 and have attachment regions 50.1, 50.2, and 51. As seen in FIG. 2, these attachment regions 50.1, 50.2, and 51 are preferably formed into flanges having at least one traversing opening 55. However, other forms for the attachment regions are also contemplated. The housing 1 can thus be installed in a wide range of support types using the mounting plates 22 and 23 with appropriately formed attachment regions, e.g. attachment regions 50.1, 50.2, and 51.

With reference next to FIGS. 3 and 4, the side walls 5, 6 of the one-piece housing 1 and the rear wall 4 include guide elements 8, 8', 18 adapted to receive a circuit board 10. In the illustrated embodiment, the guide elements of the side walls 5, 6 are simple recesses 8, 8', while the guide elements 18 of the rear wall 4 include electrically conducting contacts.

With reference to FIGS. 8 and 9, the contacts 18 include a fork-shaped region 48 that impinge upon and support the circuit board 10. The contacts 18 also include a region 49 which connects with the rear wall 4. The region 49 includes at least one opening 52 for embedding and pressing together with a projection 53 (FIG. 4) of the rear wall 4. As best seen in FIG. 3, this arrangement provides secure support of the circuit board 10 inside the metal housing 1 that is equipped with installation plates 22, 23.

The projections 40 arranged on the bottom plate 2 and/or the cover plate 3 are preferably arranged in rows. However, other arrangements of these projections are also contemplated, such as a cross-shaped projection or other arrangement, based upon the design and shape of the corresponding support plate 22, 23.

With reference to the embodiment of FIGS. 1 through 3, the attachment region 51 is located in the vicinity of the opening 30 of the metal housing 1. The attachment region 51 is connected via an edge 28 of the mounting plate 22 with the attachment region 50.2. The attachment region 50.1 is preferably arranged in parallel with the rear wall 4. The attachment region 50.1 includes a flange.

Figure 10:
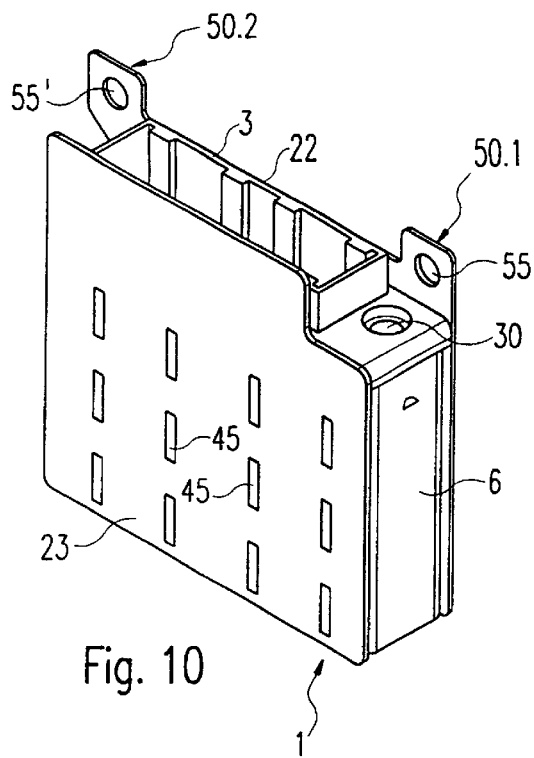
FIG. 10 shows a perspective view of a metal housing in accordance with another embodiment of the invention.
Figure 11:
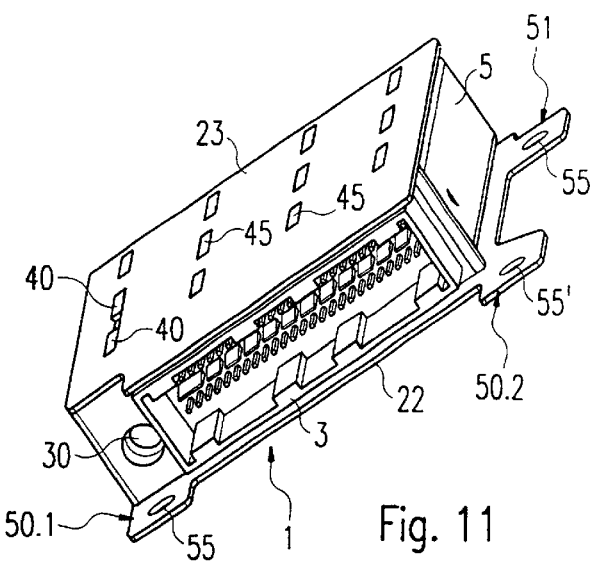
FIG. 11 shows a perspective view of the housing of FIG. 10.
Figure 12:
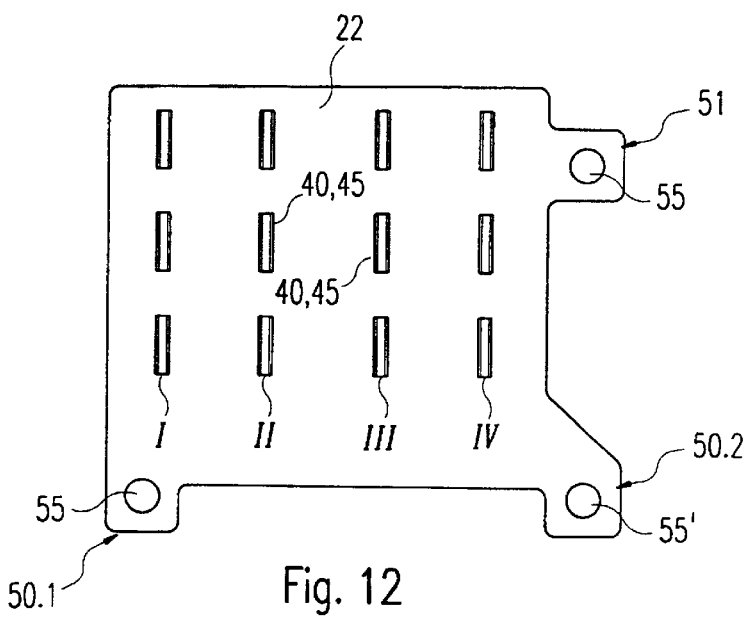
FIG. 12 shows a top view of the housing of FIG. 10.

With reference to FIGS. 10 through 12, a housing in accordance with another embodiment of the invention will be described. The installation plate 22, which in the exemplary embodiment of FIGS. 10 through 12 includes three attachment regions 50.1, 50.2, and 50.3, is attached to the cover plate 3 of the metal housing 1 in such a fashion that the installation plate 22 is rotated by 180° vis-a-vis the original position. Consequently, the attachment region 50.1 is located in the area of the opening 30 of the metal housing 1 and parallel to the attachment region 50.2. The attachment region 50.2 includes a through-pass opening 55' which in the illustrated embodiment is a longitudinal hole. The attachment region 51 is arranged parallel to the side wall 5 of the metal housing 1. The three regions 50.1, 50.2, 50.3 include flanges.

The installation plate 22 also includes recesses 45. In a manner similar to that of the embodiment of FIGS. 1 through 3, projections 40 embed into and, after positioning, compress into the recesses 45.

Figure 13:
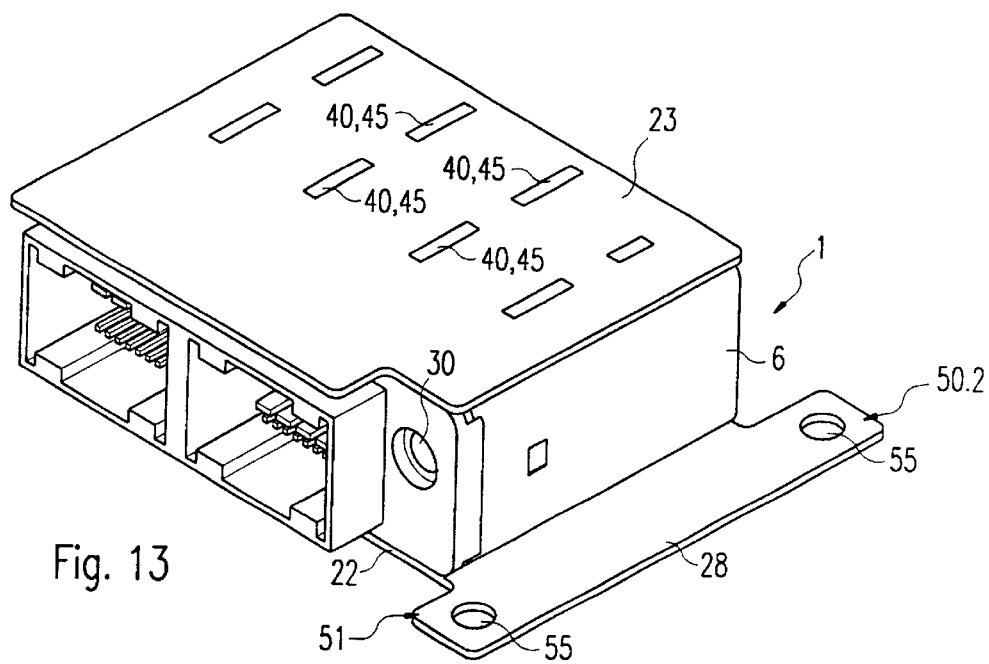
FIG. 13 shows a perspective view of a metal housing in accordance with another embodiment of the invention.
Figure 14:
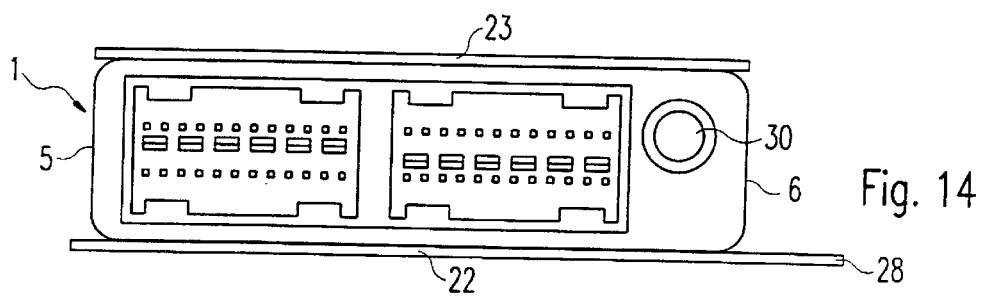
FIG. 14 shows a front view of the housing of FIG. 13.
Figure 15:
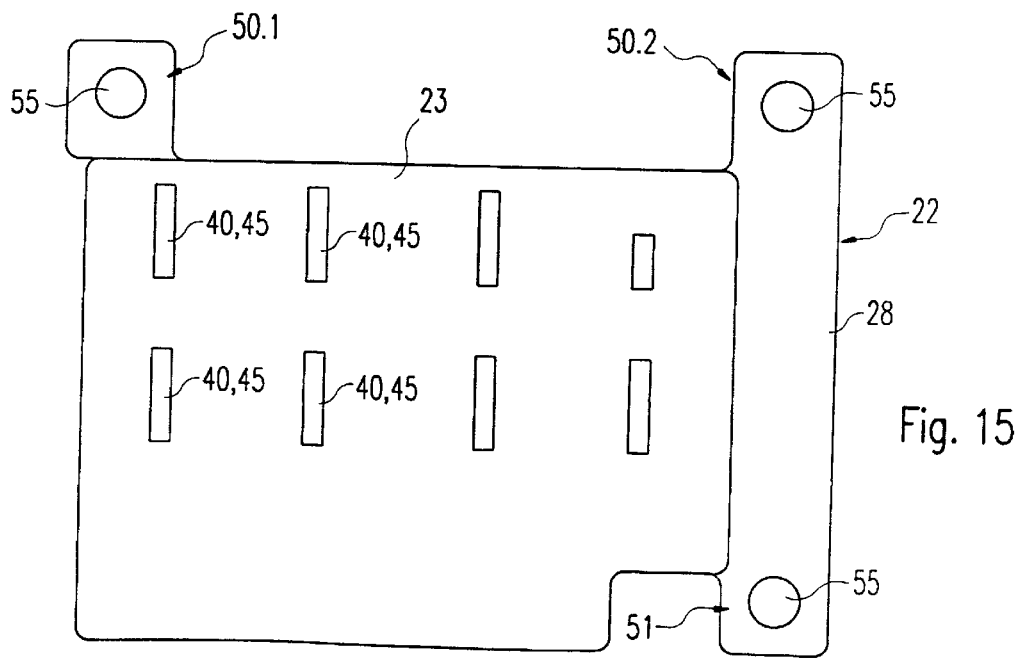
FIG. 15 shows a top view of the housing of FIG. 13.

With reference to FIGS. 13 through 15, a housing in accordance with yet another embodiment of the invention will be described. In this embodiment, the attachment regions 50.2 and 51 are arranged at ends of an edge 28 of the mounting plate 23, in the vicinity of the opening 30 of the metal housing 1 and along-side the side wall 6. As seen in FIG. 15, the third attachment region 50.1 includes a flange and extends alongside the rear wall 4 of the metal housing 1.

The three aforementioned embodiments have in common that the one installation plate 22 includes at least three attachment regions 50.1, 50.2, 51, and is connectable either with the bottom plate 2 or the cover plate 3 of the housing 1 via the recesses 45 and the projections 40. Furthermore, the embodiment of FIGS. 10 through 12 shows that the installation plate 22 is selectively attachable to the bottom plate 2 or to the cover plate 3 of the housing 1, rotated by 180° vis-a-vis the original position. Thus, a single metal housing is attached to associated support members or areas in a wide variety of ways as desired using differently designed installation plates 22, 23.

Moreover, the metal housing 1 is advantageously produced by extrusion molding. This production method enables manufacture of housings having different lengths without incurring added manufacturing costs. By merely providing a detent (not shown) when cutting the housing to length, a diversity of housing sizes are produced. This expands the functional scope of the housings, and also enables optional integration of other electronic sub-assemblies into the housing 1.

Beneficially, the invention enables use of only a single housing type in a wide range of applications through simple use of different bottom/cover plate combination(s), resulting in reduced inventory maintenance costs. The extrusion molding process and the versatile attachment options afforded by the installation plates 22, 23 result in substantial reduction in the cost of the metal housing 1.

Overall, this results in a simply constructed metal housing, which has particular application for an airbag control device, that can be employed in conjunction with a diversity of installation arrangements corresponding to a wide range of vehicle types, while substantially reducing the inventory maintenance costs.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A housing for use with an associated an airbag control device, the housing comprising:
   a bottom plate;
   an installation plate adapted to connect with the bottom plates, the installation plate additionally being adapted to attach to an associated supports;
   a plurality of projections on the bottom plate; and,
   a plurality of recesses defined by the installation plate, the plurality of recesses being adapted to receive the plurality of projections.

2. The housing as set forth in claim 1, wherein:
   the installation plate is adapted to attach to the bottom plate in a first orientation;
   relative to the bottom plate in a second orientation relative to the bottom plate that is rotated 180° relative to the first orientation.

3. The housing as set forth in claim 1, further comprising:
   guide elements adapted to receive an associated circuit board.

4. The housing as set forth in claim 1, further comprising:
   a rear wall;
   side walls;
   recesses disposed on the side walls and adapted to receive edges of an associated circuit board; and
   electrically conducting contacts disposed on the rear wall and adapted to electrically connect with the associated circuit board.

5. The housing as set forth in claim 4, wherein the electrically conducting contacts comprise:
   a mechanical supporting element adapted to mechanically support the associated circuit board.

6. The housing as set forth in claim 1, further comprising:
   at least one detent connection that connects the terminating element with the front side of the housing.

7. The housing as set forth in claim 1, wherein the terminating element comprises a plastic material.

8. The housing as set forth in claim 1, further comprising:
   a circumferential gasket providing sealing between the terminal element and the front of the housing.

9. A metal housing for use with an associated airbag control device, the housing comprising:
   a bottom plate;
   a cover plate;
   a rear wall;
   two side walls;
   at least one receiver element arranged in the interior of the housing and adapted to receive at least one printed circuit board;
   a terminating element arranged at a front side of the housing, the terminating element being adapted to connect with at least one connection element;
   an installation plate adapted to connect with at least one of the bottom plate and the cover plate, the installation plate additionally being adapted to attach to an associated support;
   a plurality of projections on at least one of the bottom plate and the cover plate; and,
   a plurality of recesses on in the installation plate adapted to receive the projections.

10. The metal housing as set forth in claim 9, wherein:
    the projections are arranged into a plurality of parallel rows on at least one of the bottom plate and the cover plate.

11. A metal housing for use with an associated airbag control device, the housing comprising:
    a bottom plate;
    a cover plate;
    a rear wall;
    two side walls;
    at least one receiver element arranged in the interior of the housing and adapted to receive at least one printed circuit board;
    a terminating element arranged at a front side of the housing, the terminating element being adapted to connect with at least one connection element;
    an installation plate adapted to connect with at least one of the bottom plate and the cover plate, the installation plate additionally being adapted to attach to an associated support; and,
    attachment regions formed by the installation plate for adapting the housing for connection with the associated support, the attachment regions at least partially protruding beyond the bottom plate or the cover plate.

12. The metal housing as set forth in claim 11, wherein at least one attachment region defines a traversing opening or hole arranged therein.

13. The metal housing as set forth in claim 11, further comprising a flange formed into an attachment region.

14. The metal housing as set forth in claim 11, wherein the attachment regions are formed into an edge of the installation plate.

15. A housing for use with an associated airbag control device, the housing comprising:
    a bottom plate;
    a cover plate;
    a rear wall;
    two side walls;
    at least one receiver element arranged in the interior of the housing and adapted to receive at least one printed circuit board;
    a terminating element arranged at a front side of the housing, the terminating element being adapted to connect with at least one connection element;

an installation plate adapted to connect with at least one of the bottom plate and the cover plate, the installation plate additionally being adapted to attach to an associated support;

recesses disposed on the side walls and adapted to receive edges of an associated circuit board; and, electrically conducting contacts disposed on the rear wall and adapted to electrically connect with the associated circuit board, wherein the electrically conducting contacts include:
  a fork-shaped region selectively connectable with the associated circuit board; and
  a region having an opening mechanically connectable with a projection of the rear wall.

16. A housing for an airbag control device comprising:

a hollow metal-extruded shell having a connection side, including a plurality of projections, the shell defining grooves adapted to receive an associated printed circuit board;

a terminating element that closes off one end of the extruded shell and that electrically connects with the associated printed circuit board; and an installation plate defining a plurality of recesses selectively receiving the plurality of projections to connect with the connection side of the shell, the installation plate additionally being adapted to attach to an associated support of an associated motor vehicle.

17. The housing as set forth in claim 16, further comprising:

a plurality of first interconnecting elements disposed on the connection side of the shell; and a plurality of second interconnecting elements disposed on the installation plate that cooperate with the first interconnecting elements to effectuate the connection between the installation plate and the shell.

* * * * *